United States Patent

Mori et al.

[11] Patent Number: 5,120,370
[45] Date of Patent: Jun. 9, 1992

[54] CLEANING PROCESS

[76] Inventors: Shinichi Mori, 27-52, Kinugawa 1-chome, Otsu-shi, Shiga; Tomohiro Nomura, 1-1-10, Tsukamoto, Yodogawa-ku, Osaka-shi, Osaka, both of Japan

[21] Appl. No.: 678,202

[22] Filed: Apr. 1, 1991

[51] Int. Cl.⁵ .................. B08B 3/00; B08B 3/10; F26B 3/00
[52] U.S. Cl. .................. 134/22.15; 134/22.19; 134/24; 134/30; 134/35; 134/36; 134/37; 134/105; 134/108; 134/902; 34/22; 34/218
[58] Field of Search ............ 134/22.15, 22.19, 24, 134/30, 35, 36, 37, 105, 108, 902; 34/22, 218

[56] References Cited

U.S. PATENT DOCUMENTS 4,186,032  1/1980  Ham .................. 134/37
4,977,688  12/1990  Roberson, Jr. et al. .......... 134/902

Primary Examiner—Theodore Morris
Assistant Examiner—Zeinab El-Arini
Attorney, Agent, or Firm—Burns, Doane, Swecker & Mathis

[57] ABSTRACT

A cleaning process and its relative apparatus for cleaning a substance placed in a cleaning space to which superheated steam is supplied and filled thereby making the space under a state of non-oxygen. Greater cleaning effect can be obtained without using any toxic substance.

7 Claims, 3 Drawing Sheets

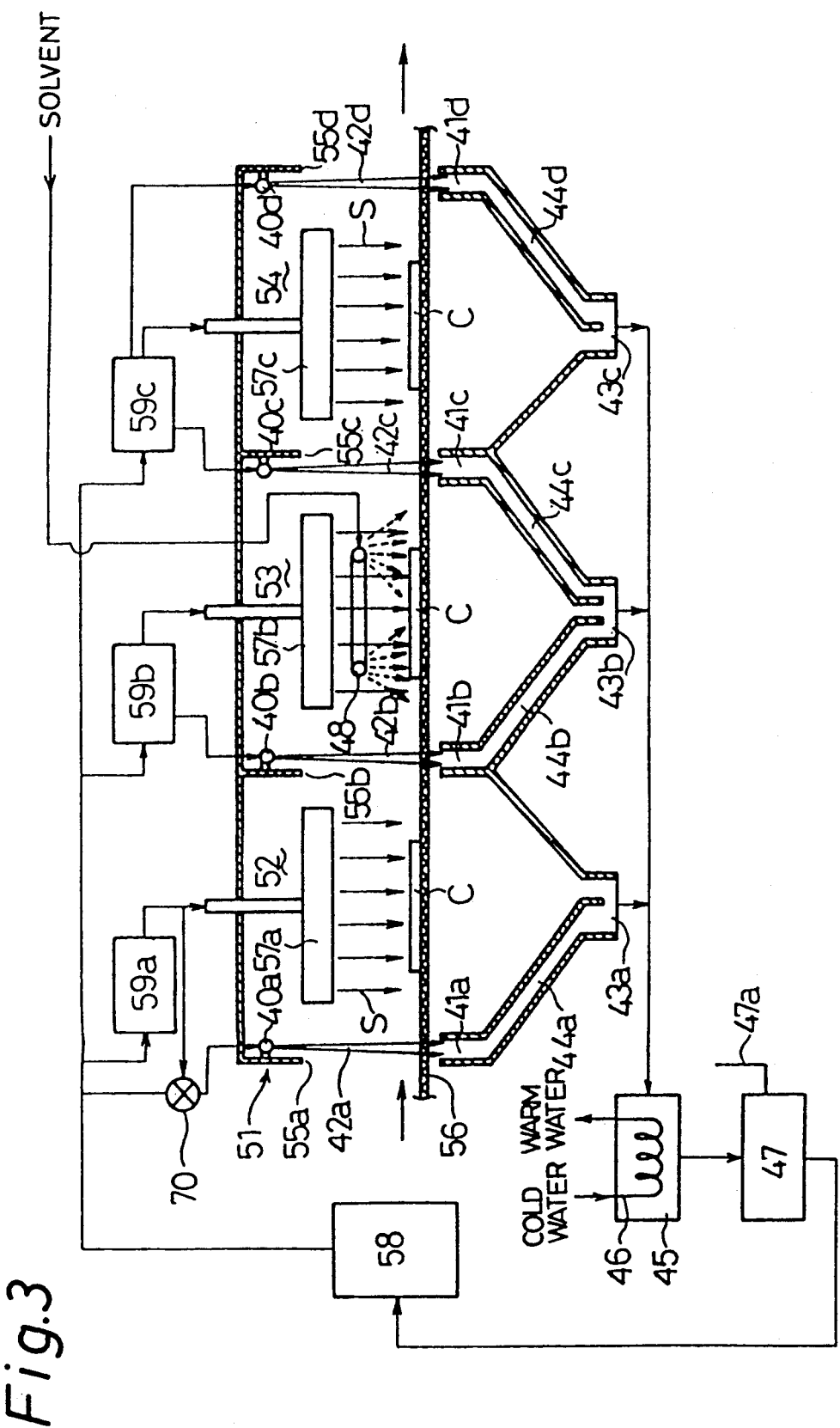

CLEANING PROCESS

BACKGROUND OF THE INVENTION

1. Technical Field of the Invention

The present invention relates to a cleaning process and a relative apparatus which are utilized for cleaning electronic parts, printed circuit boards and the like.

2. Description of Related Art

Heretofore, chloro-fluorocarbon (CFC 113) has been mainly used for cleaning printed circuit boards and the like since it possess no inflammability, corrosiveness and toxicity. However, there is a movement to restrict the use of the chloro-fluorocarbon because it has become evident that the chloro-fluorocarbon causes destruction of the ozone layer.

As a substitute detergent for the chlorofluorocarbon, alcohols solvent such as IPA (Isopropyrene alcohol) is considered to be a favorable substitute. Other various organochlorine solvents such as trichloroethylene are also listed as substitutes for the chloro-fluorocarbon. There is however a problem that the alcohols solvent such as IPA are dangerous to handle since they are combustible. While, the organochlorine solvents such as trichloroethylene can be used as effective detergents, however, they are harmful to the human body, and handling of the detergents is very difficult since it worsens the working environment and invites environmental pollution.

SUMMARY OF THE INVENTION

In view of the above-described various problems inherent in the conventional cleaning procedures and its related apparatus, it is an object of the present invention to provide a cleaning process and a relative apparatus capable of obtaining greater cleaning effect without using toxic substance which exert bad influence on the human body and invite environmental pollution.

A cleaning process of the present invention is characterized in that a substance to be cleaned is placed in a cleaning space full of superheated steam which is being continually supplied and discharged, thereby making the space under a state of non-oxygen or almost non-oxygen, and then the substance which has been cleaned is taken out of the cleaning space.

The apparatus according to the present invention comprises a cleaning chamber for accommodating a substance to be cleaned and taking out the substance after it has been cleaned provided with an arrangement to intercept outside air, a means for supplying superheated steam to the cleaning chamber and a means for discharging the superheated steam in the cleaning chamber.

The pressure in the cleaning space may be set at atmospheric pressure or may also be set at an pressure higher or lower than the atmospheric pressure. As a typical example of the cleaning space, the cleaning space which is full of superheated steam under the state of completely non-oxygen is suggested. However, mixture of small amount of oxygen (or air) in the cleaning space may be tolerable to the extent that it does not exert bad influence to the substance to be cleaned by oxidation.

The temperature of superheated steam is properly set according to the substance to be cleaned, however, it is generally preferable to set the temperature at 150° C.-400° C. under atmospheric pressure. In the case when pressure is lower than atmospheric pressure, it may be set below 100° C.

With the arrangement described above, superheated steam can be mainly utilized as a cleaning means so that there is no bad influence to the human body, and environmental pollution can be prevented. The dust stuck to the substance to be cleaned is removed by the flow of the superheated steam. Even if the dust is firmly stuck to the substance by oil, the oil is boiled and evaporated by the heat of the superheated steam to completely remove the dust. The cleaning chamber is basically kept under a state of non-oxygen, and therefore, it may protect the dust and oil from being firmly stuck to the substance by oxidation. Thus, the dust stuck to the substance can be completely removed. Even the dust stuck to the very narrow space can be surely removed by boiling and evaporating effects of the superheated steam penetrated therinto. Moreover, since the substance is cleaned by superheated steam which is a dry gas, the substance taken out from the cleaning space is cleaned dry, and any watermark caused by impure substance in liquid can be prevented.

Since superheated steam is used, even if its temperature is high, the glass constituent or the like of the substance to be cleaned is not cracked by heat shock. The reason is not known clearly, however, it may be assumed that steam is condensed instantly when it has contacted the substance to be cleaned, and heat is absorbed for evaporating the condensed moisture, thereby gradually transmitting the heat, and eventually there occurs no heat shock.

Even if the substance which had actually cracked by heat shock in liquid at the temperature of 90° C., it did not crack in superheated steam even at the temperature of 400° C. Further, since the substance to be cleaned is laid in superheated steam, germicidal action is remarkably effected.

In the cleaning process and apparatus described above, a solvent (alcohols solvent such as IPA, kerosene, light oil and the like are cited) may be added to the flow of superheated steam according to the requirement. It is preferable to add the solvent by spraying it in a liquid state on the substance to be cleaned. By adding the solvent in such a way, the cleaning effect is further improved with the cleaning effect of the solvent. Even if the solvent is added, explosion or the like can be prevented since the cleaning space is kept basically under a state of non-oxygen. When the solvent is taken out from the cleaning space together with the superheated steam and condensed, it is mixed with water and then separated for re-utilization. Dust and smell are also collected at the same time.

It is preferable to arrange a means for controlling the temperature of superheated steam so as to adapt to the degree of stain and the quality of the substance to be cleaned.

In order to improve the cleaning effect of the apparatus of the present invention by spraying superheated steam on the substance to be cleaned, it is preferable to arrange a distribution jet head as a means for supplying superheated steam. It is also preferable to arrange a steam supply outlet, in addition to the distribution jet head, for supplying superheated steam to the entire cleaning chamber so that the chamber can quickly reach a predetermined temperature when the apparatus starts its operation.

The cleaning apparatus of the present invention can be classified into two kinds; batch type and continuous cleaning type. In the former type, a batch type cleaning chamber is provided, while in the latter, steam curtain is preferably utilized.

In the batch type cleaning apparatus, there is provided a means for timely varying the temperature of the cleaning chamber. It is preferable to arrange the apparatus so as to control the temperature of the chamber in order of preheating, cleaning and cooling process. With the arrangement, the substance to be cleaned is effectively prevented from heat shock, and at the same time, re-contamination of the substance by water mark and the like can also be effectively prevented.

In the continuous cleaning type apparatus, it is preferable to arrange a cleaning chamber wherein passing openings of transport means are formed on the sides walls opposite to each other for transporting the substance to be cleaned, and at the location of the passing opening of the transport means, an interception means is provided for intercepting the internal and external atmosphere by the flow of superheated steam. With the arrangement, a substance can be cleaned by passing it through the cleaning chamber with the substance being placed on the transport means. It is not necessary to open and close a door at this time, and the substance can be supplied to the cleaning chamber and discharged therefrom continuously for effective cleaning operation.

In the continuous cleaning type apparatus, it is preferable to provide a preheating chamber and a cooling chamber with steam curtains like the one provided in the cleaning chamber so that heat shock and re-contamination can be prevented, wherein the preheating chamber and the cooling chamber are arranged in front of and behind the cleaning chamber.

Cooling operation for cooling the cleaning chamber and cooling chamber can be effectively accomplished by an evaporation cooling method wherein a solution of azeotropic mixture is sprayed to obtain a low temperature superheated steam space. Temperature can be effectively regulated by mixing ratio of the solvent These and other objects and features of the present invention will become more apparent from the following description taken in conjunction with the accompanying drawings which illustrate specific embodiments of the invention.

BRIEF DESCRIPTION OF THE DRAWINGS

FIG. 3 is a cross-sectional view showing a third cleaning machine to which the present invention is applied.

DESCRIPTION OF THE PREFERRED EMBODIMENTS

Embodiments of the present invention will now be described hereinafter referring to the accompanying drawings.

Figure 1:
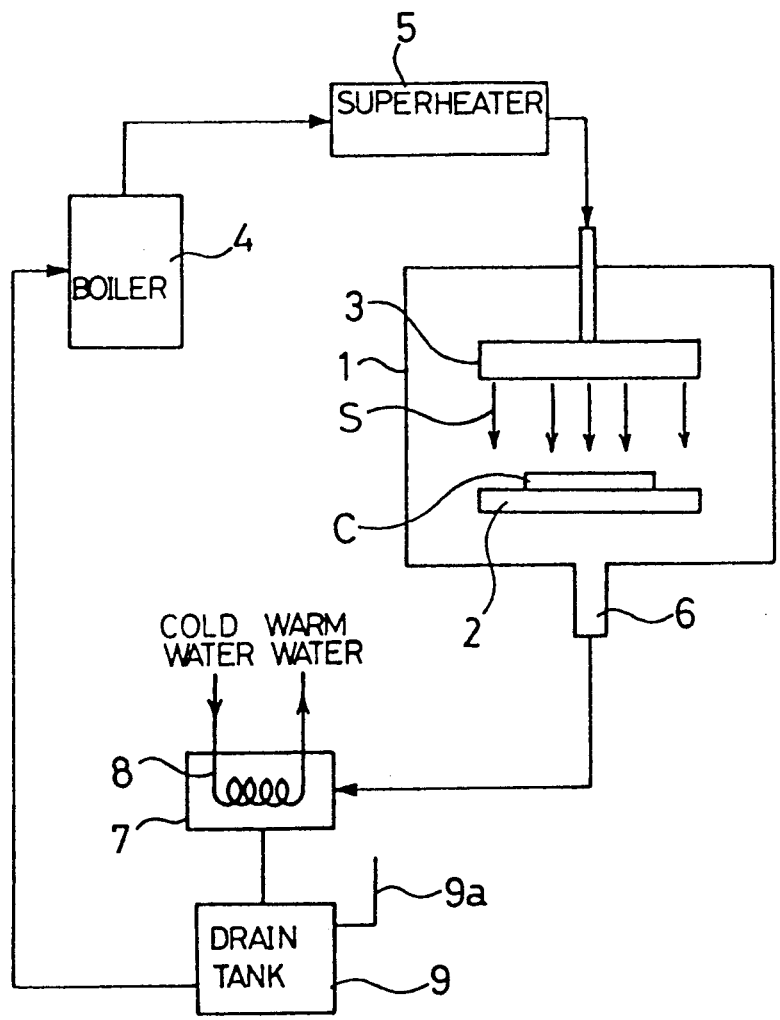
FIG. 1 is a schematic view showing a first cleaning apparatus to which the present invention is applied.

FIG. 1 shows a cleaning apparatus in simple construction which properly shows the present invention theoretically.

At the lower portion in a cleaning chamber 1, there is provided a support member 2 for placing and supporting a substance C to be cleaned. Above the support member 2, there is disposed, with a proper space, a distribution jet head 3 for substantially forming equal flows of superheated steam S toward the support member 2. To the distribution jet head 3, the superheated steam S which is obtained by further superheating the steam generated in a boiler 4 to a predetermined temperature by a superheater 5 is supplied. The superheater 5 incorporates a heater so that superheated steam at an optional temperature can be obtained.

Under the lower portion of the cleaning chamber 1, there is formed an outlet 6 and it is connected to a condenser 7. Reference numeral 8 designates a cooling pipe disposed in the condenser 7. When cold water or cold air is supplied, it is thermally exchanged and warm water or warm air is discharged.

The water condensed by the condenser 7 is collected in a drain tank 9 and then supplied to the boiler 4 from the drain tank 9 for circulative utilization. Reference numeral 9a designates an exhaust pipe of the drain tank 9. The dust and the like contained in the condensed water is properly removed by a filter means.

In order to wash the substance C with the arrangement as described above, the steam generated in the boiler 4 is superheated to make it a superheated steam S by the superheater 5 under a state that the cleaning chamber 1 is closed with respect to the outside space, and the superheated steam is supplied to the cleaning chamber 1, while cold water is supplied to the cooling pipe 8 of the condenser 7 and the superheated steam S discharged from the outlet 6 is condensed so that the superheated steam S in the cleaning chamber 1 is absorbed to form the flow of the superheated steam in the cleaning chamber 1 and air, particularly its oxygen, is discharged to make the atmosphere in the cleaning chamber 1 filled with the superheated steam S of 150° C.-400° C. under a state that there exists no oxygen.

Then, by maintaining the atmosphere in the cleaning chamber 1, a substance to be cleaned C is supplied and placed on the support member 2 by a proper means. At this stage, even if a high temperature superheated steam S is utilized, the steam is instantly condensed when it has contacted the substance to be cleaned and heat is absorbed to evaporate the condensed water. Heat is then gradually transmitted so that glass constituent and the like of the substance to be cleaned C is prevented from cracking by heat shock.

By disposing a substance to be cleaned C in the flow of the superheated steam S, the dust stuck to the substance C is removed by the flow of the superheated steam S. Even if the dust is firmly stuck by oil it is blown away since the oil is boiled and evaporated by the superheated steam S. Since the inside of the cleaning chamber 1 is kept under a state of non-oxygen, dust and oil do not firmly stick to the substance, and therefore, the dust can be surely removed.

After a cleaning operation is conducted for a predetermined period of time, a completely cleaned and dried substance C can be obtained from the cleaning chamber 1. In other words, since the superheated steam S which is dried gas in high temperature is used for cleaning, a substance C which is cleaned dry can be obtained, and there is no watermark left caused by impure substance.

Figure 2:
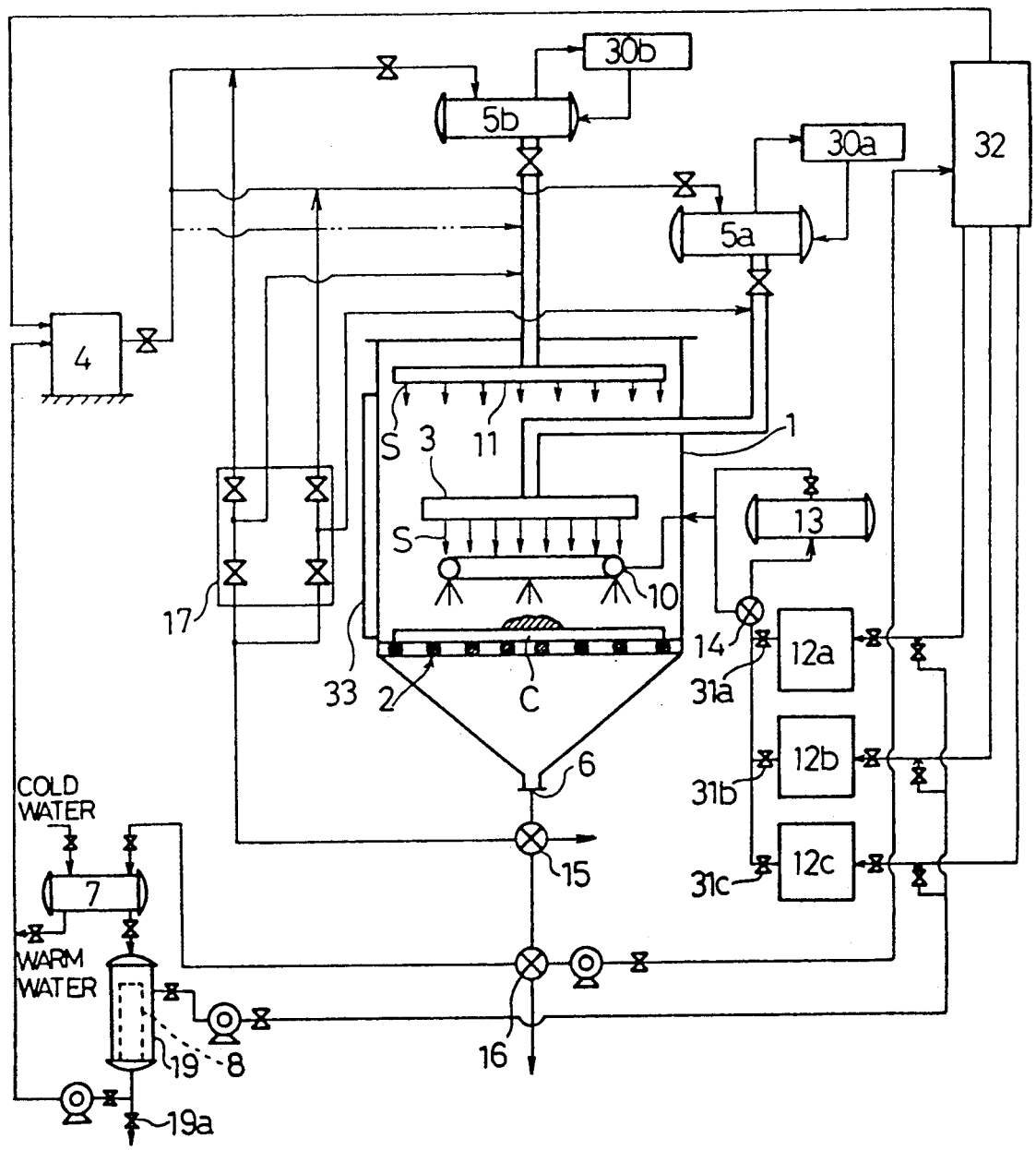
FIG. 2 is a schematic view showing a second cleaning apparatus to which the present invention is applied.

FIG. 2 shows an apparatus which is capable of cleaning a substance C by using only superheated steam and is also capable of cleaning a substance C by using superheated steam and solvent.

In this apparatus, at the lower portion inside a cleaning chamber 1, there is disposed a support member 2 for placing and supporting a substance to be cleaned C. Above the support member 2, there is disposed, with a proper space, a distribution jet head 3 for substantially forming equal flows of superheated steam S toward the support member 2. To the distribution jet head 3, the superheated steam S which is obtained by further superheating the steam generated in a boiler 4 to a predetermined temperature by a first superheater 5a is supplied. The steam generated in the boiler 4 is superheated to a predetermined temperature by a second superheater 5b to make it a superheated steam S and then the superheated steam S is supplied to the entire cleaning chamber. The superheaters 5a and 5b incorporate heaters respectively so that superheated steam can be obtained at an optional temperature. Temperature control devices 30a and 30b are therefore provided therewith.

Solvent of every kind such as IPA is lead to a solvent jet nozzle 10 in the cleaning chamber 1 from solution tanks 12a, 12b and 12c and substantially equally sprayed toward a substance to be cleaned C therefrom. In a supply path between the solution tanks 12a, 12b, 12c and the solvent jet nozzle 10, there are provided solvent selection valves 31a, 31b, 31c and a supply path changeover valve 14. A vaporizer 13 is arranged on the other side of the supply path to be selected. A specially selected solvent or combined solvent in a liquid state or vaporized state can thus be supplied by selecting solvents and changing over the supply paths.

The solvent mixed steam discharged from an outlet 6 in the cleaning chamber 1 is principally lead to a condenser 7 passing through a first three-way changeover valve 15 and a second three-way changeover valve 16, and is then forwarded to a separator 19 in liquid.

The cooling water used for cooling the condenser 7 is discharged in warm water, however, by supplying the warm water to a boiler 4, energy can be saved. The steam mixed with solvent is separated into water and solvent by the separator 19, and rubber and the like are removed by a filter means and the like. The water is returned to the boiler 4 and the solvents are returned to each corresponding solution tanks 12a, 12b and 12c. It is arranged to drain water and the like from a drain outlet 19a of the first and second three-way changeover valves 15, 16 and the separator 19, and the pressure in the cleaning chamber 1 can thus be regulated.

The first three-way changeover valve 15 is arranged to forward the steam mixed with solvent (it is preferable when there is steam only or the ratio of mixture with solvent is low) discharged from the drain outlet 6 to a distribution valve 17. The distribution valve 17 is able to flow back the steam either to one of the first superheater 5a, second superheater 5b, distribution jet head 3 and vapor supply inlet 11 or to a plurality of the locations. Accordingly, the thermal energy which is contained in the steam can be effectively utilized.

The second three-way changeover valve 16 is arranged to forward solvent mixed steam discharged from the drain outlet 6 to a distillation tower 32 which serves as a separator. Liquid and gas are separated hereat and then each one of the condensed solvents is returned to corresponding solution tanks 12a, 12b and 12c for re-utilization. The water separated in the distillation tower 32 is returned to the boiler 4.

Reference numeral 33 designates a door for letting in and out a substance to be cleaned C. It is preferable to arrange the door and the cleaning chamber 1 in explosion-proof construction.

With the above-described arrangement, when a substance C is cleaned, the steam generated in the boiler 4 is superheated to make it as a superheated steam S by the superheaters 5a and 5b under a state that the cleaning chamber 1 is closed with respect to the outside space and the superheated steam S is supplied to the cleaning chamber 1, while cold water is supplied to the condenser 7 to condense the superheated steam S drained from the drain outlet 6 so that the superheated steam S in the cleaning chamber 1 is absorbed to form the flow of the superheated steam S in the cleaning chamber 1 and air, particularly oxygen, is discharged to make the atmosphere in the cleaning chamber 1 filled with the superheated steam S of 150° C.–400° C. under a state that there exists no oxygen. Whenever it is necessary, solvent is supplied from the solution tank 12a, 12b and 12c to add to the superheated steam.

Then, by maintaining the atmosphere in the cleaning chamber 1, a substance to be cleaned C is supplied and placed on the support member 2 by a proper means. At this stage, even if a high temperature superheated steam S is utilized, the steam is condensed instantly when it has contacted the substance to be cleaned C, and heat is absorbed in order to evaporate the condensed water. Since the heat is gradually transmitted, glass constituent and the like of the substance to be cleaned C is prevented from cracking by heat shock.

By disposing a substance to be cleaned C in the flow of the superheated steam S, the dust stuck to the substance C is removed by the flow of the superheated steam S. Even if the rubber is firmly stuck by oil, it is blown away since the oil is boiled and evaporated by the superheated steam S. Since the inside of the cleaning chamber 1 is kept under a state of non-oxygen, dust and oil do not firmly stick to the substance, and therefore, the dust stuck can be surely removed.

After a cleaning operation is conducted for a predetermined period of time, a completely cleaned and dried substance C can be obtained when it is taken out of the cleaning chamber 1. In other words, since the substance is cleaned by the superheated steam S which is a dry gas in high temperature, a dry cleaned substance C can be obtained when it is taken out of the cleaning chamber 1, and there is no watermark left caused by impure substance.

In the case when a solvent is added to a superheated steam, the cleaning effect is highly improved since the cleaning effect of the solvent is added to the cleaning effect of the superheated steam. Even if the solvent such as IPA which possesses dangerous explosive property is used, it is advantageous that there is no danger of explosion since it is used in the cleaning chamber 1 where oxygen is not present basically. Further, the solvent is condensed after it has been taken out of the cleaning space together with steam and then separated for re-utilization.

In the batch type cleaning apparatus, it is also preferable to subsequently conduct three process of preheating, cleaning and cooling by timely varying the temperature in the cleaning chamber 1.

As a first means to conduct the operation, it is suggested that the amount of the superheated steam in the cleaning chamber 1 is to be controlled. As a second means, it is suggested that the temperature in the cleaning chamber 1 is to be controlled by making use of the temperature control means 30a and 30b provided with the superheaters 5a and 5b.

In the preheating process in this case, it is possible to guide moist steam in the boiler 4 direct into the cleaning chamber 1 as shown by phantom line in FIG. 1. It is preferable to spray low temperature superheated steam (at around 110° C. when cleaning chamber is kept at atmospheric pressure) to the substance to be cleaned C in the cooling process in this case.

Besides, as a means to effectuate a cooling process among the process of preheating, cleaning and cooling, the following processes may be suggested; (1) evaporation cooling process by spraying a single solution, (2) evaporation cooling process by spraying a mixed solution which are insoluble mutually and (3) evaporation cooling process by spraying a solution of azetropic mixture. These processes can be performed by utilizing the solution tanks 12a, 12b and 12c. In the case of (3) above, there are advantages that the boiling point can be lowered, and at the same time, the boiling point can be regulated by changing the mixing ratio of two liquids. In the preheating process also, the supply of solvents in the solution tanks 12a, 12b and 12c to the cleaning chamber may be considered.

FIG. 3 shows a cleaning apparatus of continuous cleaning type.

Reference numeral 51 designates a cleaning device which is divided into three chambers of preheating chamber 52, cleaning chamber 53 and cooling chamber 54 all linearly aligned, and on the side walls opposite to the parallel direction of the chambers 52, 53, 54, , there are formed passing openings 55a, 55b, 55c and 55d. A transport means 56 such as net conveyer is arranged so as to pass through each chamber 52, 53, and 54 through the passing openings 55a, 55b, 55c and 55d.

In each one of the chambers 52, 53 and 54, distribution jet heads 57a, 57b and 57c are disposed above the transport means 56, with a proper space therebetween, to substantially uniformly form the flow of superheated steam S toward the transport means 56. To the distribution jet heads 57a, 57b and 57c, the superheated steam S which is obtained by further superheating the steam generated in a boiler 58 to a predetermined temperature by superheaters 59a, 59b and 59d is supplied. Each superheater 59a, 59b and 59c incorporates a heater so that superheated steam at an optional temperature can be obtained.

At the upper portion of each one of the passing openings 55a, 55b, 55c and 55d, there are disposed steam jet nozzles 40a, 40b, 40c and 40d to which the steam generated in the boiler 58 and passed through the superheaters 59a, 59b and 59c is supplied.

At the lower portion of each passing openings 55a, 55b, 55c and 55d, there are disposed absorption inlets 41a, 41b, 41c and 41d opposite to each one of the steam jet nozzles 40a, 40b, 40c and 40d. Interception means (steam curtains) 42a, 42b, 42c and 42d for intercepting the atmosphere in and out of each chamber 52, 53 and 54 by the flow of superheated steam are also provided. It may also be arranged to supply moist steam from the boiler 58 to the steam jet nozzle 40a at the entrance of the preheating chamber 52. A changeover valve 70 is therefore provided for this purpose.

At the lower portion of each chamber 52, 53 and 54, there are formed drain outlets 43a, 43b and 43c and they are connected to the condenser 45. In order to raise the sucking force at the absorption inlets 41a, 41b, 41c and 41d, absorption paths 44a, 44b, 44c and 44d are provided for directly communicating the absorption inlets 41a, 41b, 41c and 41d with the drain outlets 43a, 43b and 43c.

Reference numeral 46 designates a cooling pipe disposed in the condenser 45. When cold water is supplied thereto, it is thermally exchanged and warm water is drained. The water condensed in the condenser 45 is collected in a drain tank 47 and then supplied to the boiler 58 for circulative utilization. Reference numeral 47a designates a drain pipe of the drain tank. The dust and the like contained in the condensed water is properly removed by a filter means.

At the location between the distribution jet head 57b and the transport means 56, there is provided a jet nozzle 48 for uniformly spraying alcohols solvent or an organic solvent in a liquid state toward the substance to be cleaned C placed on the transport means 56.

Though an illustration is omitted in the figure, the cleaning device 51 is arranged in an explosion-proof construction in order to maintain the safety when alcohols solvent and organic solvent are used. It is also preferable to provide a means to absorb steam and the like which leak from the steam curtains 42a, 42b, 42c and 42d at the locations of inlet and outlet of the cleaning device 51.

With the arrangement described above, when a substance to be cleaned C is cleaned, the steam generated in the boiler 58 is supplied to the steam jet nozzles 40a, 40b, 40c and 40d, and the steam is made as superheated steam S by the superheaters 59a, 59b and 59c. The superheated steam S is then supplied to the distribution jet heads 57a, 57b and 57c in the preheating chamber 52, cleaning chamber 53 and cooling chamber 54 respectively. At the same time, cold water is supplied to the cooling pipe 46 in the condenser 45, and the steam drained from the drain outlets 43a, 43b and 43c is condensed. Then, each of the passing openings 55a, 55b, 55c and 55d is intercepted by the steam curtains 42a, 42b, 42c and 42d made of the flow of the steam sprayed from the steam jet nozzles 40a, 40b, 40c and 40d and absorbed into the absorption inlet 41a, 41b, 41c and 41d to close the atmosphere in each chamber 52, 53 and 54 relative to the outside atmosphere. The superheated steam S in each chamber 52, 53 and 54 is also absorbed from the drain outlet 43a, 43b and 43c.

As a result, the flow of superheated steam S is formed in each chamber 52, 53 and 54, and air, particularly its oxygen, in the chambers 52, 53 and 54 is discharged to cause the inside of the chambers to be under a state of non-oxygen. The superheaters 59a, 59b and 59c are also set so as to make the temperature of the preheating chamber 52, cleaning chamber 53 and cooling chamber 54 at a predetermined atmospheric temperature of 150° C.–400° C. For instance, the cleaning chamber 53 is set at 250° C., and the preheating chamber 52 and cooling chamber 54 are set at 150° C. so as not to invite abrupt change in temperature between the outside air and the cleaning chamber 53.

Then, when the inside of each chamber 52, 53 and 54 are stabilized under a state of non-oxygen and the flow of superheated steam S is also stabilized under a predetermined temperature, a substance to be cleaned C is placed on the transport means 56 and subsequently forwarded to each chamber 52, 53 and 54. At this stage, the substance to be cleaned C is abruptly exposed to high temperature superheated steam S between the temperatures of outside air and the preheating chamber 52. However, since it is steam, the steam is condensed instantly when it has contacted the substance to be cleaned and heat is absorbed in order to evaporate the condensed moisture. The heat is gradually transmitted so that glass constituent and the like of the substance C is prevented from cracking by heat shock. Further, since the substance C is sent out to the outside air from the cleaning chamber 53 through the cooling chamber 54, there is no abrupt change in temperature in the cooling process, and therefore, heat shock is not occurred.

The substance to be cleaned C thus passes through the preheating chamber 52, cleaning chamber 53 and cooling chamber 54, and the dust stuck to the substance C is removed by the flow of superheated steam S during the substance C is placed in the flow of the superheated steam S in the cleaning chamber 53. Even if dust is firmly stuck by oil, the oil is boiled and the dust is blown away by the heat of the superheated steam S. Since the inside of the cleaning device 51 is kept under a state of non-oxygen, dust and oil do not firmly stick to the substance by oxidation, and therefore, the dust which is stuck to the substance is surely removed. Washing effect is further improved by spraying solvent such as alcohols in a liquid state toward the substance C from the jet nozzle 48 according to the requirement.

The substance to be cleaned C is subsequently preheated, cleaned and cooled during the course the substance is transported by the transport means 56, and it is discharged out of the cleaning device 51. A completely cleaned and dried substance C can thus be obtained finally. Since the substance is cleaned by superheated steam S which is dried gas in high temperature, a completely cleaned and dried substance is obtained when it is taken out of the cooling chamber 54. Watermark caused by impure substance which occurs when liquid solvent is used can also be avoided.

In the apparatus described above, an example has been shown wherein the preheating chamber 52 and cooling chamber 54 are arranged on both sides of the cleaning chamber 53. If, however, the temperature of the superheated steam in the cleaning chamber 53 is not too high, it is not necessary to provide the preheating chamber and the cooling chamber. An apparatus which is provided with only cleaning chamber may be utilized.

In addition to the apparatus illustrated in FIG. 3, various means as illustrated in FIG. 2, for instance, the temperature control devices 30a, 30b, distillation tower 32 and the like may be combined. Solvent such as alcohols solvent may be supplied to the preheating chamber 52 of the apparatus shown in FIG. 3.

In either one of the apparatus illustrated in FIGS. 1, 2 and 3, it may be preferable to arrange the apparatus so as to maintain a superheated steam S under a state of dry by irradiating far infrared rays from the side of the cleaning chamber 1 or cleaning device 51.

Although the present invention has been fully described by way of examples with reference to the accompanying drawings, it is to be noted that various changes and modifications will be apparent to those skilled in the art. Therefore, unless otherwise such changes and modifications depart from the scope of the present invention, they should be construed as being included therein.

What is claimed is:

1. A process for cleaning a substance on which is located undesirable material, comprising the steps of:
   maintaining a cleaning chamber under a substantially oxygen-free state by continually supplying and discharging superheated steam into and out of the cleaning chamber;
   placing a substance to be cleaned within the substantially oxygen-free cleaning chamber so that undesirable material located on a surface of the substance is boiled and removed by the superheated steam that is continually supplied to and discharged from the cleaning chamber; and
   removing the substance in cleaned condition from the cleaning chamber after a predetermined period of time.

2. The process as defined in claim 1, wherein solvent such as alcohols solvent is added to the superheated steam.

3. The process as defined in claim 2, wherein the solvent such as alcohols solvent is sprayed in a liquid state toward the substance to be cleaned.

4. The process as defined in claim 1, including the steps of conveying the superheated steam discharged from the cleaning chamber to a condenser, and condensing the superheated steam in the condenser.

5. The process as defined in claim 4, including the step of supplying the liquid condensed by the condenser to a boiler which is connected to a superheater that supplied the superheated steam to the cleaning chamber.

6. The process as defined in claim 11, including the steps of conveying the substance through a preheating chamber prior to placement in the cleaning chamber, and conveying the cleaned substance through a cooling chamber after removal from the cleaning chamber.

7. The process as defined in claim 11, wherein the step of placing the substance in the cleaning chamber includes the step of placing the substance on a support that is located in the cleaning chamber and that is subjected to the continual supply and discharge of superheated steam without being cooled.

* * * * *